United States Patent
Hoffman et al.

(10) Patent No.: US 7,374,984 B2
(45) Date of Patent: May 20, 2008

(54) METHOD OF FORMING A THIN FILM COMPONENT

(76) Inventors: Randy Hoffman, 2924 NE. Newcastle Pl., Corvallis, OR (US) 97330; Peter Mardilovich, 4327 NW. Silverbelle Pl., Corvallis, OR (US) 97330; David Punsalan, 1024 Colony Pond Dr., Eugene, OR (US) 97401

( * ) Notice: Subject to any disclaimer, the term of this patent is extended or adjusted under 35 U.S.C. 154(b) by 109 days.

(21) Appl. No.: 10/977,068

(22) Filed: Oct. 29, 2004

(65) Prior Publication Data
US 2006/0094168 A1 May 4, 2006

(51) Int. Cl.
*H01L 21/84* (2006.01)
(52) U.S. Cl. ............ 438/164; 438/591; 257/411; 257/E21.177; 257/21.413
(58) Field of Classification Search ......... 438/164, 438/591; 257/411, E21.177, E21.413
See application file for complete search history.

(56) References Cited

U.S. PATENT DOCUMENTS

| | | | |
|---|---|---|---|
| 4,514,253 A | | 4/1985 | Minezaki |
| 5,328,861 A | * | 7/1994 | Miyakawa ............ 438/151 |
| 6,521,489 B2 | * | 2/2003 | Duthaler et al. .......... 438/149 |
| 6,737,287 B1 | | 5/2004 | Furuse et al. |
| 6,767,760 B2 | * | 7/2004 | Horikoshi et al. ............ 438/97 |
| 6,791,144 B1 | | 9/2004 | Fryer |
| 6,919,158 B2 | * | 7/2005 | Kawamura et al. ...... 430/270.1 |
| 7,011,996 B2 | * | 3/2006 | Okumura et al. .......... 438/164 |
| 2002/0173130 A1 | | 11/2002 | Pomerede |
| 2003/0059987 A1 | * | 3/2003 | Sirringhaus et al. ........ 438/149 |
| 2003/0068581 A1 | | 4/2003 | Kawamura et al. |
| 2003/0160235 A1 | | 8/2003 | Hirai |
| 2003/0175551 A1 | | 9/2003 | Smith et al. |
| 2003/0210311 A1 | | 11/2003 | Kim et al. |
| 2003/0230967 A1 | | 12/2003 | Kawamura et al. |
| 2004/0002225 A1 | | 1/2004 | Wong et al. |
| 2004/0004220 A1 | * | 1/2004 | Suzuki ................ 257/66 |
| 2004/0009304 A1 | | 1/2004 | Pichler et al. |
| 2004/0092073 A1 | | 5/2004 | Cabral |
| 2004/0115344 A1 | | 6/2004 | Newsome et al. |
| 2004/0124418 A1 | * | 7/2004 | Yamazaki et al. ............ 257/72 |
| 2004/0129978 A1 | | 7/2004 | Harai |
| 2004/0144975 A1 | | 7/2004 | Seki et al. |
| 2004/0147066 A1 | | 7/2004 | Yamazaki et al. |
| 2004/0147113 A1 | | 7/2004 | Yamazaki et al. |
| 2004/0169176 A1 | | 9/2004 | Peterson |

FOREIGN PATENT DOCUMENTS

DE 28 37 433 3/1979

OTHER PUBLICATIONS

Vanfleteren, "A four-vaccuum-cycle lift-off process . . . ", IEEE Electron Device Letters, vol. 6, No. 1, Jan. 1, 1985, pp. 11-13, XP001292098, Lab of Elect, Ghent St Univ, Belgium.
Van Calster, "A new technology for fast switching circuits on glass", IEEE Electron Device Letters, vol. 8, No. 10, Oct. 10, 1987, pp. 477-479, XP001292093,Lab of Elect, Belgium.
Jaeger, "2D channel transport of metal-insulator semiconductor . . . ", Semiconductor Science & Tech, IOP, Bristol, GB, vol. 9, No. 1, Jan. 1994, pp. 54-60, XP000440612.

* cited by examiner

*Primary Examiner*—B. William Baumeister
*Assistant Examiner*—Steven J. Fulk

(57) ABSTRACT

Embodiments of methods, apparatuses, devices, and/or systems for forming a thin film component are described.

26 Claims, 3 Drawing Sheets

METHOD OF FORMING A THIN FILM COMPONENT

BACKGROUND

Electronic devices, such as integrated circuits, solar cells, and electronic displays, for example, may be comprised of one or more electrical components, such as one or more thin film transistors. Methods and/or materials utilized to form electrical components such as these may vary, and one or more of these methods and/or materials may have particular disadvantages. For example, use of such methods and/or materials may be time-consuming and/or expensive, and/or may not produce components and/or devices having the desired characteristics.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description when read with the accompanying drawings in which:

DETAILED DESCRIPTION

Figure 1:
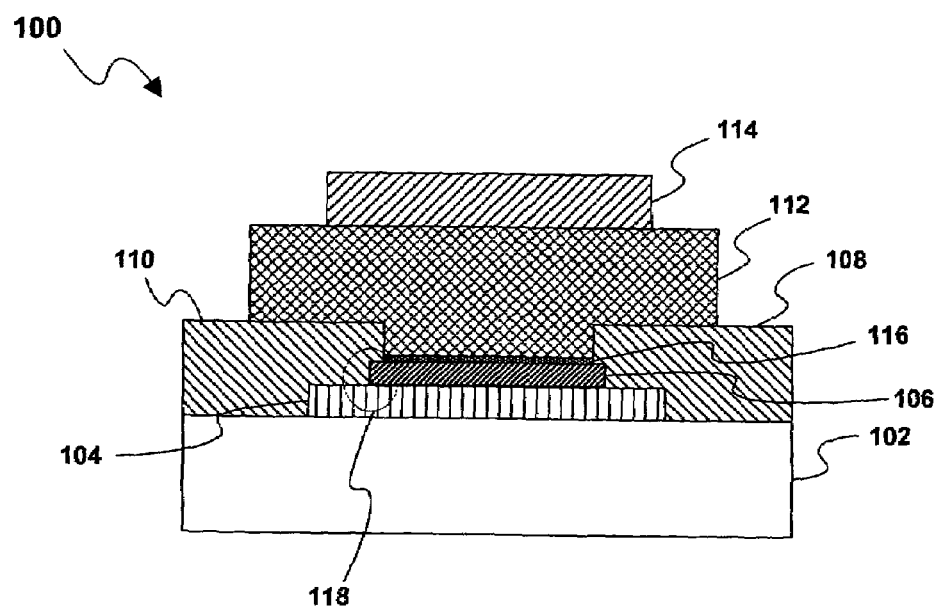
FIG. 1 is a cross sectional view of one embodiment of a thin film component.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Electronic devices, such as semiconductor devices, display devices, nanotechnology devices, conductive devices, and/or dielectric devices, for example, may be comprised of one or more thin films, which may additionally be referred to as component layers, and one or more component layers may be comprised of one or more layers of material, referred to as material layers, for example. In this context, the term thin film refers to a layer of one or more materials formed to a thickness, such that surface properties of the one or more materials may be observed, and these properties may vary from bulk material properties. The one or more component layers may be further comprised of one or more material layers, and the one or more materials comprising the material layers may have electrical and/or chemical properties, such as conductivity, chemical interface properties, charge flow, and/or processability, for example. The one or more material layers may additionally be patterned, and, in combination with one or more other material layers, may form one or more component layers, which, in combination with one or more other component layers, may form one or more electrical components, such as thin film transistors (TFTs), capacitors, diodes, resistors, photovoltaic cells, insulators, conductors, optically active components, or the like. Thin film components, such as TFTs, in particular, may, for example, be utilized in devices, including smart packages such as radio-frequency identification (RFID) tags and/or display devices, including, for example, electroluminescent and/or a liquid crystal displays (LCD), such as an active matrix liquid crystal display (AMLCD) devices, for example.

At least as part of the fabrication process of electronic components, such as thin film components, including, for example, thin film transistors, one or more layers of material may be formed at least as part of one or more of the component layers, such as by forming at least a portion of a channel layer and/or a gate dielectric layer as part of a thin film transistor, wherein one or more of the component layers may be comprised of multiple material layers, for example. In this embodiment, as at least a part of the fabrication process, one or more material layers may be formed by use of one or more formation processes, and/or by use of one or more materials, such as a combination of materials. For example, one or more sputter deposition processes, chemical vapor deposition (CVD) processes and/or one or more evaporation deposition processes may be utilized. However, in one particular embodiment, at least a portion of a component, such as a thin film component, may be formed by use of one or more processes referred to as solution processes, for example. Solution processing, as used in this context, comprises one or more processes, wherein a solution, such as a substantially liquid solution, which may additionally be referred to as a liquid precursor in at least one embodiment, may be deposited on one or more surfaces of a component, such as on one or more surfaces of a substrate, by use of one or more deposition processes. Components, such as electronic components, including TFTs, for example, which may be at least partially formed by one or more processes such as solution processes may be referred to as solution processed components, for example. In one embodiment of solution processing, an ejection mechanism, such as an ink jet device, may deposit and/or jet one or more materials onto a surface, in order to substantially form a material layer, for example. Utilization of one or more ejection mechanisms, such as an ink jet device, including a thermal ink jet (TIJ) device, for example, may additionally be referred to as a direct write solution process, as just an example. Additionally, one or more spin coating processes and/or one or more contact printing processes, wherein one or more printing devices may print materials such as liquid materials on to a surface, may be utilized in one or more embodiments of solution processing, although these are just a few examples, and claimed subject matter is not so limited. For example, one or more dip coating and/or spray coating processes, screen printing processes, chemical bath deposition processes and/or successive ionic layer absorption and reaction processes may be utilized in one or more embodiments of solution processing, for example, although it is worthwhile to note that claimed subject matter is not limited to the use of solution processing to form one or more layers of material, for example. Additionally, as used herein, an ejection device, such as a jetting device, including an ink jet device, may comprise a mechanism capable of ejecting material such as a liquid, for example, and may eject material in the form of drops, for example, such as mechanically and/or electrically, and/or in response to electrical signals, and may be capable of ejecting material in controlled portions, in a controlled manner, and/or in a controlled direction, for example. Additionally, an ejection device may operate by use of one or more ejection schemes, including piezo ejection, acoustic ejection, continuous ejection, thermal ejection, and/or flex tensioned ejection, and may be comprised of multiple nozzles, for example, but, again, claimed subject matter is not limited to these examples.

Although claimed subject matter is not so limited, in one particular embodiment, an electronic component, such as a thin film component, may comprise at least one channel layer, at least one gate dielectric layer, and one or more electrodes, such as source, drain, and/or gate electrodes, for example, and the particular configuration of these layers and/or components may depend at least in part on the particular type of thin film component and/or electronic device being formed, for example. In at least one embodiment of claimed subject matter, an encapsulation layer is formed on or over at least a portion of the thin film component, such as substantially between the gate dielectric layer and the channel layer, for example. In at least one embodiment, an encapsulation layer may be configured to encapsulate at least a portion of the residual contaminants that may result from the formation of one or more layers of a thin film component, wherein the contaminants may be deposited on the gate dielectric layer and/or channel layer, and/or may encapsulate and/or protect the gate dielectric layer/channel layer interface, as explained in more detail later. The encapsulation layer is comprised of one or more materials, and in one embodiment, the encapsulation layer may comprise a dielectric material. Additionally, in this embodiment, the encapsulation layer dielectric material may be substantially similar to the material comprising the gate dielectric layer of the component, although in alternative embodiments, the materials may differ, for example. Particular characteristics and/or functions of an encapsulation layer formed in accordance with at least one embodiment may be better understood in reference to the accompanying figures.

Referring now to FIG. 1, there is illustrated a cross-sectional view of one embodiment 100 of an electronic component with an encapsulation layer, wherein the electronic component may comprise a thin film component, and may be comprised of multiple component layers, for example. Embodiment 100, here, comprises substrate 102. Formed on or over at least a portion of substrate 102 is a channel layer 104. An encapsulation layer 106 is formed on or over at least a portion of the channel layer 104. One or more electrodes, such as drain electrode 108 and/or source electrode 110 may be formed on or over at least a portion of the channel layer 104, encapsulation layer 106, and/or the substrate 102, for example. A gate dielectric layer 112 may be formed on or over at least a portion of electrodes 108 and/or 110, and/or at least a portion of encapsulation layer 106. A gate electrode 114 may be formed on or over at least a portion of gate dielectric layer 112, for example. In this particular configuration, component 100 may be referred to as a top gate thin film transistor, due at least in part to the gate electrode 114 being formed above the channel layer 104 and the gate dielectric layer 112, for example, although it is worthwhile to note that this is just one embodiment, and claimed subject matter is not limited in this respect, but may comprise other configurations such as bottom gate transistors, as explained in more detail later. Additionally, it is noted, of course, here and throughout this description that claimed subject matter is not limited to the abovementioned layers being formed on or over one another. For example, other layers may be included, such as between various layers, so that layers may be formed over one another rather than on one another, depending, for example, on the particular embodiment. In this particular embodiment, as illustrated in portion 118, the source electrode 110 and/or drain electrode 108 may be formed on at least a portion of the encapsulation layer 106, such that the encapsulation layer 106 may be between at least portion of the gate dielectric 112 and the source and drain electrodes 110 and 108, such as illustrated in portion 118, for example. In at least one embodiment, this configuration may provide particular functions, such as by providing substantial coverage of channel layer 104 formed between source electrode 110 and drain electrode 108, for example. However, it is worthwhile to note that claimed subject matter is not so limited, and in other embodiments, the encapsulation layer may not be formed between the gate dielectric 112 and the source and drain electrodes 110 and 108, as just an example.

In this particular embodiment, formation of the encapsulation layer 106 may provide at least partial encapsulation, protection, and/or sealing of the channel layer/gate dielectric layer interface, such as from residual contaminants, illustrated as residual contaminants 116, and which may result from the formation of one or more portions of component 100, such as may be formed during the formation of one or more electrodes, including electrodes 108 and/or 110, for example. Depending at least in part on the one or more processes and/or materials utilized to form one or more portions of a component, such as one or more electrodes of component 100, formation of one or more portions may result in the production of one or more residual contaminants 116, such as debris and/or impurities, for example, and these contaminants may be deposited on or over portions of a partially formed component, and may affect component performance, such as by altering one or more electrical properties and/or electrical performance of the channel layer/gate dielectric layer interface, as just an example. Further, one or more solution processes may be utilized to form one or more portions of component 100, such as one or more electrodes, and, as a result, residual contaminants 116 may be deposited on or over one or more portions of one or more component layers of component 100, for example.

Production of contaminants such as residual contaminants 116 may result from one or more formation processes, such as solution processes, and may result from factors including migration of the one or more materials used to form one or more components, such as by wicking of the one or more materials after solution processing deposition, for example, and/or may be caused by misdirected nozzles of an ejection mechanism, as just a few examples. However, it is worthwhile to note that claimed subject matter is not so limited, and numerous other causes of the production of residual contaminants 116 exist within the scope of claimed subject matter. Additionally, claimed subject matter is not limited in scope to the formation of an encapsulation layer wherein the encapsulation layer encapsulates residual contaminants resulting from said formation. In one embodiment, no residual contaminants 116 may exist, and the encapsulation layer may seal, protect, and/or encapsulate a component layer interface, such as a channel/gate dielectric layer interface, for example. Although residual contaminants 116 are illustrated as a layer formed on at least a portion of encapsulation layer 106, it is worthwhile to note that claimed subject matter is not limited to a layer of contaminants, and/or a layer formed on the encapsulation layer, and this is primarily for illustrative purposes. For example, if one or more residual contaminants are formed on one or more layers of component 100, in one or more embodiments, residual contaminants 116 may be formed on or over one or more of the layers of component 100, such as on a plurality of layers of component 100, for example. In at least one of the aforementioned embodiments, the encapsulation layer may chemically and/or electrically define and/or modify the channel/gate dielectric interface, such as by being formed between and comprising part of the channel layer and the gate dielectric layer interface, for example. One or more chemical properties of the channel/gate dielectric interface of a component, such as component 100, may affect interfacial electronic properties of the component, such as by modifying the properties and/or distribution of electronic states of at least a portion of the component, and this modification may be due, for example, to defects and/or other variations in chemical bonding or composition at or near the interface, for example. Additionally, in at least one embodiment, the existence of an encapsulation layer 106 substantially between the channel layer 104 and the source electrode 110 and drain electrode 108 may result in an impediment to current injection into and extraction from the channel layer (i.e. increased contact resistance). However, in this embodiment, this impediment may be reduced and/or eliminated by selection of a particular thickness for the encapsulation layer 106. For example, if the encapsulation layer is sufficiently thin, effects such as these may be reduced such that component performance may not be unduly affected, for example, although, of course, claimed subject matter is not so limited.

As alluded to previously, formation of residual contaminants, such as residual contaminants 116 on or over one or more component layers of component 100, and/or between one or more component layers may affect performance of a component, such as by resulting in undesirable interface properties. For example, in component 100, wherein electrodes 108 and 110 are formed on or over at least a portion of channel layer 104, residual contaminants resulting from the formation of the electrodes 108 and/or 110 may be formed on or over at least a portion of the channel layer 104, such as a portion of the channel layer where the electrodes are not formed, for example. In this embodiment, if encapsulation layer 106 is not formed on channel layer 104 prior to the formation of the electrodes 108 and 110, one or more residual contaminants may be formed on or over the surface of channel layer 104, and may be subsequently encapsulated at the channel layer/gate dielectric layer interface, such as when a subsequent material layer is formed on or over the channel layer, for example. Encapsulation of the one or more contaminants at the channel layer/gate dielectric layer interface in this manner may typically result in undesirable chemical and/or electrical effects, such as when component 100 is implemented as a TFT in an electronic device. For example, transistor performance may be affected and/or reduced by the existence of residual contaminants at the channel layer/gate dielectric interface, such as by reducing charge transport capabilities, reducing charge mobility, affecting component stability and/or producing components with varying and/or unpredictable performance characteristics, for example, although, again, claimed subject matter is not limited to just these cited examples.

Figure 2:
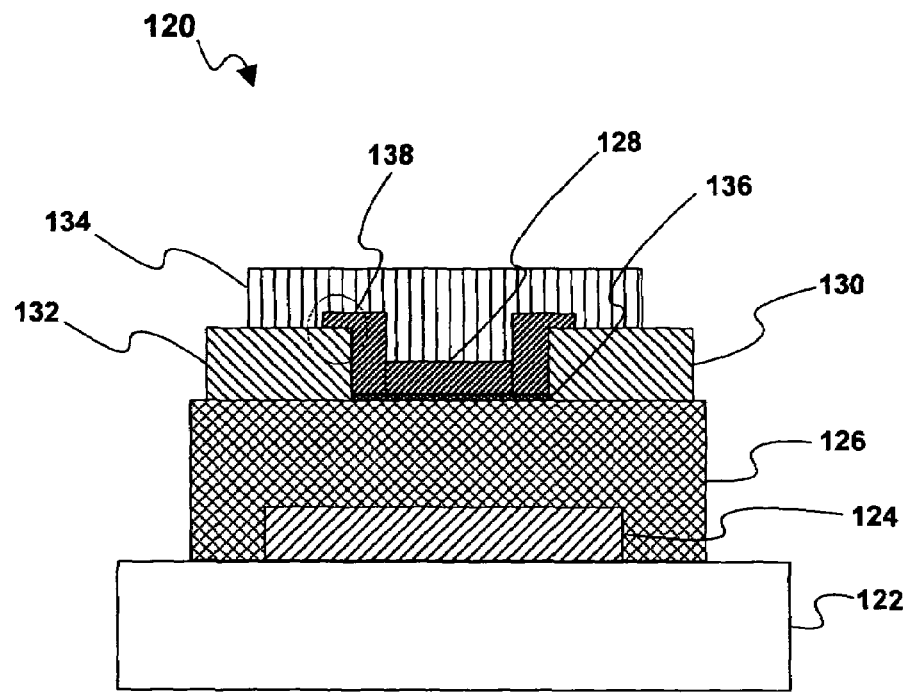
FIG. 2 is a cross sectional view of another embodiment of a thin film component.

Referring now to FIG. 2, there is illustrated a cross-sectional view of another embodiment 120 of a thin film component with an encapsulation layer, wherein the thin film component may comprise multiple component layers, for example. Embodiment 120, here, comprises substrate 122. Formed on or over at least a portion of substrate 122 is a gate electrode 124, and formed on or over at least a portion of the gate electrode 124 and/or the substrate 122 is a gate dielectric layer 126. One or more electrodes, such as drain electrode 130 and/or source electrode 132 may be formed on or over at least a portion of the gate dielectric layer 126, for example. An encapsulation layer 128 is formed on or over at least a portion of the gate dielectric layer 126 and/or drain electrode 130 and/or source electrode 132. Additionally, a channel layer 134 may be formed on or over at least a portion of the encapsulation layer 128 and/or electrodes 130 and/or 132, for example. In this particular configuration, component 120 may be referred to as a bottom gate thin film transistor, because the gate electrode 124 is formed below the channel layer and the gate dielectric layer, for example, although it is worthwhile to note that this is just one embodiment, and claimed subject matter is not limited in this respect. As described previously in reference to FIG. 1, the encapsulation layer may encapsulate one or more residual contaminants 136, such as resulting from the of formation of one or more components and/or material layers of component 120, and/or isolate said contaminants from the channel layer/gate dielectric layer interface, in at least one embodiment, and this may result in the reduction and/or elimination of undesirable electrical and/or chemical effects that may be caused by one or more residual contaminants, in at least one embodiment, as explained previously.

In this particular embodiment, as illustrated in portion 138, the encapsulation layer 128 may overlap at least a portion of the source electrode 132 and drain electrode 130, such that the channel layer 134 may be formed over at least a portion of the encapsulation layer 128 formed on the source and/or drain electrodes, for example. In at least one embodiment, this overlap may provide particular functions, such as by providing substantial coverage of the channel layer/gate dielectric interface, for example. However, it is worthwhile to note that claimed subject matter is not so limited, and in other embodiments, there may be no overlap of the encapsulation layer over a portion of the source and drain electrodes. Additionally, as described in reference to FIG. 1, in at least one embodiment, the existence of an encapsulation layer 128 substantially between the channel layer 134 and the source electrode 132 and drain electrode 130 may result in an impediment to current injection into and extraction from the channel layer. However, in this embodiment, this impediment may be reduced and/or eliminated by selection of a particular thickness for the encapsulation layer 128. For example, if the encapsulation layer is sufficiently thin, effects such as these may be reduced such that component performance may not be unduly affected, for example.

Although claimed subject matter is not limited to any particular material and/or combination of materials to form one or more of the layers and/or components illustrated in FIGS. 1 and/or 2, in at least one embodiment, one or more of the component layers may comprise one or more of the following materials, discussed below. Additionally, it is worthwhile to note that claimed subject matter is not limited in this respect, and one or more of the component layers may comprise any material or combination of materials suitable for use as one or more component layers, such as any material exhibiting properties suitable for application as one or more component layers in an electronic component, for example. In this embodiment, substrates 102 and/or 122 of FIGS. 1 and 2 may comprise one or more materials suitable for use as a substrate, including, for example, silicon, silicon dioxide, one or more types of glass, one or more organic substrate materials, such as polyimides (PI), including Kapton®, polyethylene terephthalates (PET), polyethersulfones (PES), polyetherimides (PEI), polycarbonates (PC), polyethylenenaphthalates (PEN), acrylics including polymethylmethacrylates (PMMA), stainless steel, metal foils, including foils of aluminum and/or copper, and/or combinations thereof, for example, but claimed subject matter is not so limited. Additionally, in at least one embodiment, wherein a substrate material comprises one or more metals, an insulator layer may be utilized in addition to the one or more metals to form the substrate, for example. Additionally, channel layers 104 and/or 134 may be comprised of one or more materials suitable for use as a channel layer, including, for example, metal oxides such as zinc oxide, tin oxide, indium oxide, gallium oxide, cadmium oxide, lead oxide, copper oxide, silver oxide, and combinations thereof; silicon, including amorphous, nanowire, microribbon, and/or polycrystalline silicon; carbon nanotubes, GaAs, Ge, CdS, CdSe, ZnS, ZnSe, $SnS_2$, $SnSe_2$, and/or combinations thereof, for example. Additionally, electrodes 108, 110, 114, 130, 132 and/or 124 may be substantially comprised of indium tin oxide, other doped oxide semiconductors such as n-type doped zinc oxide, indium oxide, or tin oxide, and/or metals such as Al, Ag, In, Sn, Zn, Ti, Mo, Au, Pd, Pt, Cu, W and/or Ni, and/or combinations thereof, as just a few examples. Dielectric layers 112 and/or 126 may be comprised of one or more inorganic and/or organic materials. In at least one embodiment, one or more inorganic materials may be comprised of zirconium oxide, tantalum oxide, yttrium oxide, lanthanum oxide, silicon oxide, aluminum oxide, hafnium oxide, barium zirconate titanate, barium strontium titanate, silicon nitride, silicon oxynitride and/or combinations thereof, as just a few examples. Additionally, one or more organic materials may be substantially comprised of UV curable acrylic monomer, acrylic polymer, UV curable monomers, thermal curable monomers, polymer solutions such as melted polymers and/or oligomer solutions, poly methyl methacrylate, poly vinylphenol, benzocyclobutene, and/or one or more polyimides, and/or hybrid materials such as silsesquioxane resins, and/or combinations thereof, as just a few examples,. Encapsulation layer 106 and/or 128 may be comprised of one or more materials, such as one or more dielectric materials, including organic and/or inorganic materials, such as one or more of the materials described above in reference to the dielectric layers, for example. Although claimed subject matter is not limited in this respect, in at least one embodiment, the encapsulation layer may be comprised of the same or a substantially similar material or combination of materials comprising the gate dielectric layer, for example.

Formation of one or more layers of component 100 of FIG. 1 and/or component 120 of FIG. 2 may comprise one or more processes, and/or numerous process operations, but claimed subject matter is not limited to any particular method of formation of one or more layers and/or one or more electrodes of components 100 and/or 120. However, in at least one embodiment, one or more solution processes may be utilized, such as one or more of the following: ejection processes, including, for example, one or more ink jet processes, one or more thermal ink jet processes, one or more contact printing processes; one or more screen printing processes; one or more spin coating processes; one or more dip coating or spray coating processes; chemical bath deposition processes; successive ionic layer absorption and/or reaction processes, as just a few examples, but again, claimed subject matter is not so limited, and one or more processes other than one or more solution processes may be utilized to form one or more layers and/or components of the components, as stated previously. Particular methods of formation of the components illustrated herein may be better understood when explained with reference to FIG. 3, below.

Figure 3:
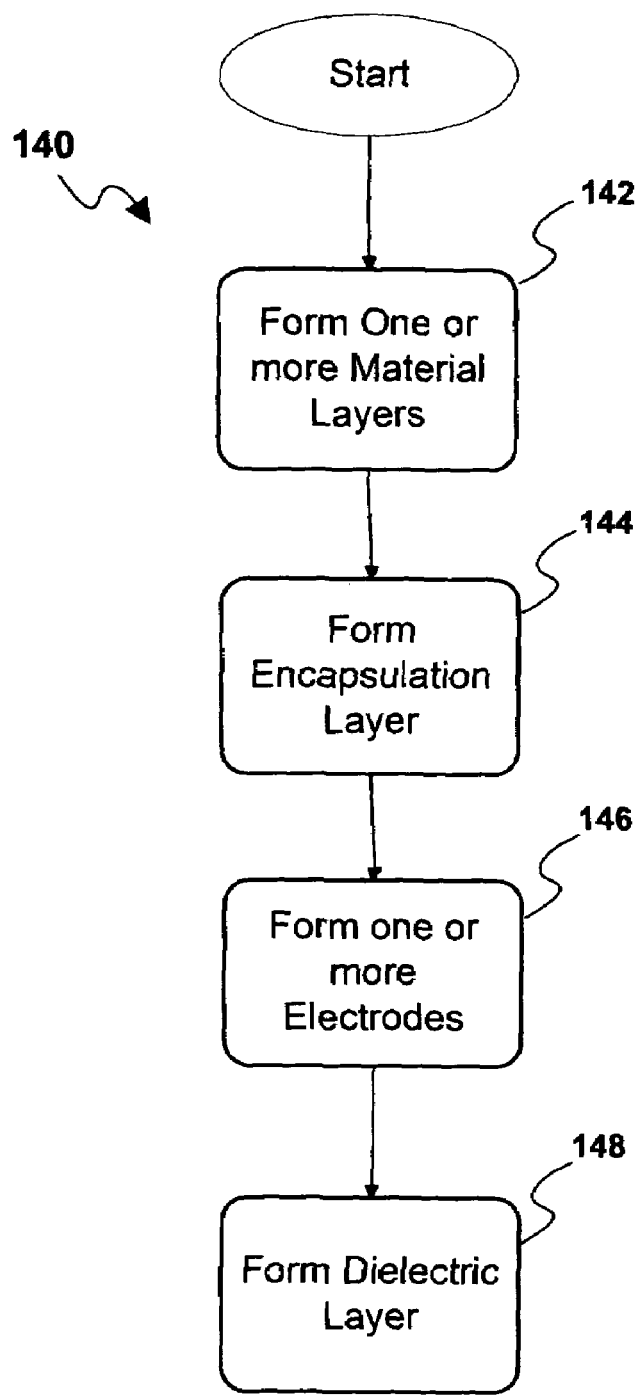
FIG. 3 is a flowchart illustrating one embodiment of a method to form a thin film component.

Referring now to FIG. 3, one embodiment of a technique for forming a thin film component is illustrated by a flowchart, although, of course, claimed subject matter is not limited in scope in this respect. Such an embodiment may be employed to at least partially form a thin film component, as described below. The flowchart illustrated in FIG. 3 may be used to form a component at least in part, such as component 100 of FIG. 1 and/or component 120 of FIG. 2, for example, although claimed subject matter is not limited in this respect. Likewise, the order in which the blocks are presented does not necessarily limit claimed subject matter to any particular order. Additionally, intervening blocks not shown may be employed without departing from the scope of claimed subject matter.

Flowchart 140 depicted in FIG. 3 may, in alternative embodiments, be implemented in hardware, and/or hardware in combination with software and/or firmware, such as part of a computer controlled formation system, for example, and may comprise discrete and/or continual operations. In this embodiment, at block 142, one or more materials may be deposited on or over at least a portion of a substrate, such as to form multiple material and/or component layers, including, for example, a channel layer. At block 144, an encapsulation layer is formed on or over one or more of the layers formed at block 142, for example. At block 146, one or more electrodes may be formed on or over at least a portion of one or more layers formed at blocks 142 and/or 144, for example. At block 148, one or more additional materials may be deposited on or over one or more of the layers formed in one or more of the preceding steps, such as by forming a gate dielectric layer, for example. In one embodiment, the one or more layers may be formed substantially in the order in which the blocks are presented, such as to form at least a portion of a top gate thin film transistor, although, as will be explained in more detail later, claimed subject matter is not limited in this respect.

In this embodiment, at block 142, one or more materials may be deposited on or over a substrate, such as to form a component layer, including a channel layer, for example. As mentioned previously, the substrate may comprise one or more types of suitable materials, and the one or more materials deposited may comprise one or more types of suitable materials, and may be deposited by use of one or more deposition methods and/or components, such as one or more solution processes and/or solution processing mechanisms such as an ejection mechanism, for example. For example, as illustrated in FIG. 1, a channel layer may be formed on at least a portion of a substrate, and the channel layer may comprise one or more material layers. In one embodiment, a channel layer may be formed by depositing a layer of zinc tin oxide from a sol-gel precursor (a sol-gel comprises metal alkoxides, which may be partially hydrolyzed/oligomerized in an alcohol solution), on or over at least a portion of a substrate, by use of an ejection device, including a thermal ink jet (TIJ) device, for example. Additionally, it is noted, of course, here and throughout this description that claimed subject matter is not limited to the deposition of materials in any particular form. For example, the one or more materials deposited to form one or more portions of one or more material and/or component layers may be in one or more forms, such as in a solid form, a substantially liquid form, a nanoparticle suspension form, in inorganic polymer sol-gel precursor form, and/or one or more types of oxide and/or precursor forms, such as metal salts, metal bidentate complexes, metal alkoxides, and/or partially polymerized metal alkoxides, as just a few examples, but the particular form of materials may depend at least in part on the type of material(s) and/or the type of deposition mechanism being utilized to deposit the material(s), for example.

However, continuing with this embodiment, at block 144, an encapsulation layer is formed on or over one or more of the layers formed at block 142, for example. In this embodiment, an encapsulation layer is formed on or over at least a portion of the one or more layers formed at block 142, such as on or over the top surface of a component layer formed at block 142. For example, a channel layer may be formed at block 142, and an encapsulation layer is formed on at least a portion of the channel layer, for example. Material(s) utilized to form the encapsulation layer may vary, and may depend at least in part on the material(s) utilized to form one or more components layers, for example. Likewise, particular processes and/or components utilized to form the encapsulation layer may vary, and may depend at least in part on the material(s) utilized to form the encapsulation layer, for example. However, in one particular embodiment, one or more dielectric materials may be utilized to form the encapsulation layer, such as a material substantially comprising zirconium oxide, which may be deposited in a sol-gel form by use of one or more solution processes, for example. In one or more embodiments, the dielectric material(s) may comprise the same or substantially similar dielectric material(s) utilized to form a gate dielectric layer, for example. In this embodiment, the material may be deposited to form a layer having a thickness within the range of approximately 5-50 nanometers (nm), for example, although, again, claimed subject matter is not so limited.

At block 146, one or more electrodes may be formed on or over at least a portion of one or more layers formed at blocks 142 and/or 144, for example. The one or more electrodes may comprise source and/or drain electrodes, such as source and drain electrodes illustrated in FIGS. 1 and/or 2, for example. The electrodes may be formed from one or more materials, and may be formed by use of one or more formation processes and/or components, as explained previously. In one particular embodiment, one or more electrodes may be substantially formed by depositing a layer of Ag from a Ag nanoparticle precursor, such as by use of an ejection device, including a thermal ink jet (TIJ) device, for example, and may be formed on or over one or more component layers. As explained previously, formation of electrodes such as these may result in the production of residual contaminants on at least a portion of one or more component layers, which may produce undesirable results, for example. At block 148, one or more additional materials may be formed on one or more of the layers formed in one or more of the preceding steps, such as by forming a gate dielectric layer, for example. In this embodiment, one or more materials may be deposited on one or more component layers formed in one or more of the preceding steps, such as to form a component layer, including a channel layer, for example. As mentioned previously, the one or more materials deposited may comprise one or more types of suitable materials, and may be deposited by use of one or more deposition methods and/or components, such as one or more solution processes and/or solution processing mechanisms such as an ejection mechanism, for example. For example, as illustrated in FIG. 1, a gate dielectric layer may be formed on at least a portion of an encapsulation layer and/or one or more electrodes, and may be formed by depositing a layer of zirconium oxide in sol-gel form, and/or a layer of UV-curable acrylic monomer, for example, on at least a portion of a substrate, such as by use of an ejection device, including a thermal ink jet (TIJ) device, for example.

Thus, a component comprising a TFT such as a top gate TFT may be formed, wherein the component comprises an encapsulation layer, wherein the encapsulation layer is formed to encapsulate at least a portion of one or more residual contaminants resulting from the of formation of one or more other portions of the component, and/or may be formed to encapsulate and/or protect an interface of one or more component layers, such as a channel layer/gate dielectric interface layer, for example. Alternatively, a TFT having a bottom gate configuration may be formed by implementation of one or more of the blocks of flowchart 140, wherein the order of the blocks may be altered such that a TFT with a configuration as illustrated and described in reference to FIG. 2 may be formed, for example, wherein the TFT may comprise an encapsulation layer formed to encapsulate at least a portion of one or more residual contaminants resulting from the of formation of one or more other portions of the component, for example, although, of course, claimed subject matter is not so limited.

It is, of course, now appreciated, based at least in part on the foregoing disclosure, that a combination of hardware with software and/or firmware may be produced capable of performing a variety of operations, including one or more of the foregoing operations implemented in a system suitable for forming a thin film component, as described previously. It will additionally be understood that, although particular embodiments have just been described, claimed subject matter is not limited in scope to a particular embodiment or implementation. For example, a system capable of implementing one or more of the abovementioned operations may comprise hardware, such as implemented to operate on a device or combination of devices as previously described, for example, whereas another embodiment may be in hardware and software. Likewise, an embodiment of a system capable of implementing one or more of the abovementioned operations may be implemented in hardware and firmware, for example. Additionally, all or a portion of one embodiment may be implemented to operate at least partially in one device, such as an ejection device, a computing device, a set top box, a cell phone, and/or a personal digital assistant (PDA), for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, a set top box, a cell phone and/or a personal digital assistant (PDA), for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive, although, again, claimed subject matter is not limited in scope to this example.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method comprising:
    depositing a material over at least a portion of a substrate to form a channel layer;
    depositing a material over just a first portion of the channel layer to form an encapsulation layer over just the first portion of the channel layer, wherein said encapsulation layer comprises dielectric material, and such that one or more second portions of the channel layer remain exposed and never have the encapsulation layer formed thereover;
    forming one or more electrodes proximate to the encapsulation layer by use of one or more solution processes, wherein at least a portion of said one or more electrodes is formed such that said at least a portion of one or more electrodes is electrically coupled to said channel layer, where just the encapsulation layer protects the first portion of the channel layer from any contaminants resulting from formation of the electrodes; and
    depositing a material over at least a portion of the substrate to form a gate dielectric layer, such that at least a portion of a thin film component is formed.

2. The method of claim 1, wherein said encapsulation layer is deposited such that at least a portion of the encapsulation layer is in contact with at least a portion of the channel layer.

3. The method of claim 1, and further comprising:
    forming a gate electrode on or over at least a portion of said gate dielectric layer to form at least a portion of a top gate thin film transistor (TFT).

4. The method of claim 3, wherein said electrodes comprise one or more of: indium tin oxide, another doped oxide semiconductor including n-type doped zinc oxide, indium oxide, tin oxide, and/or metal including Al, Ag, In, Sn, Zn, Ti, Mo, Au, Pd, Pt, Cu, and/or Ni.

5. The method of claim 1, wherein said electrodes are formed on or over at least a portion of the encapsulation layer.

6. The method of claim 1, wherein said encapsulation layer dielectric material substantially comprises one or more of: zirconium oxide, titanium oxide, tantalum oxide, yttrium oxide, lanthanum oxide, silicon oxide, aluminum oxide, hafnium oxide, barium zirconate titanate, barium strontium titanate, silicon nitride, silicon oxynitride, UV curable acrylic monomer, acrylic polymer, a UV curable monomer, a thermal curable monomer, silsesquioxane resin, polymer solution including melted polymer and/or an oligomer solution, a poly methyl methacrylate, a poly vinylphenol, a benzocyclobutene, and/or one or more polyimides.

7. The method of claim 6, wherein said encapsulation layer is formed from substantially the same material as the gate dielectric layer.

8. The method of claim 6, wherein said encapsulation layer comprises zirconium oxide, and is formed to a thickness of approximately 50 nm.

9. The method of claim 1, wherein said gate dielectric layer material substantially comprises one or more of: zirconium oxide, titanium oxide, tantalum oxide, yttrium oxide, lanthanum oxide, silicon oxide, aluminum oxide, hafnium oxide, barium zirconate titanate, barium strontium titanate, silicon nitride, silicon oxynitride, UV curable acrylic monomer, acrylic polymer, a UV curable monomer, a thermal curable monomer, silsesquioxane resin, a polymer solution including melted polymer and/or an oligomer solution, a poly methyl methacrylate, a poly vinylphenol, a benzocyclobutene, and/or one or more polyimides.

10. The method of claim 1, wherein said gate dielectric layer material substantially comprises a UV curable acrylic monomer.

11. The method of claim 1, wherein said channel layer comprises one or more of: metal oxide including zinc oxide, tin oxide, indium oxide, gallium oxide, and/or combinations thereof; silicon, including amorphous, nanowire, microribbon, and/or polycrystalline silicon, carbon nanotubes, GaAs, Ge, CdS, CdSe, ZnS, ZnSe, SnS2, and/or SnSe2.

12. The method of claim 1, wherein said one or more solution processes comprises one or more of the following: an ejection process, a contact printing process, a screen printing process, and/or a micro dispensing process.

13. The method of claim 12, wherein said ejection process comprises a thermal inkjet process.

14. A method, comprising:
    a step for depositing a material over at least a portion of a substrate to form at least a portion of a channel layer;
    a step for depositing a material over just a first portion of a substrate to form an encapsulation layer over just the first portion of the channel layer, at least a portion of said encapsulation layer comprising dielectric material, such that one or more second portions of the channel layer remain exposed and never have the encapsulation layer formed thereover; and
    a step for forming one or more electrodes over at least a portion of the substrate by use of one or more steps for solution processing; and
    a step for depositing a material over at least a portion of the substrate to form a gate dielectric layer, such that at least a portion of a thin film component is formed,
    wherein just the encapsulation layer protects and/or isolates the first portion of the channel layer from any contaminants resulting from formation of the electrodes.

15. The method of claim 14, wherein one or more electrodes are formed after said encapsulation layer is substantially formed, and wherein said one or more electrodes are formed on at least a portion of said encapsulation layer.

16. The method of claim 15, and further comprising:
    a step for forming a gate electrode on at least a portion of said gate dielectric layer, such as to form at least a portion of a top gate thin film transistor.

17. The method of claim 16, wherein said electrodes comprise one or more of: indium tin oxide, another doped oxide semiconductor including n-type doped zinc oxide, indium oxide, tin oxide, and/or metal including Al, Ag, In, Sn, Zn, Ti, Mo, Au, Pd, Pt, Cu, and/or Ni.

18. The method of claim 14, wherein said encapsulation layer is formed after said one or more electrodes are substantially formed, and wherein said encapsulation layer is formed on at least a portion of said one or more electrodes.

19. The method of claim 14, wherein said encapsulation layer is formed such that at least a portion of the encapsulation layer is in contact with at least a portion of the channel layer.

20. The method of claim 14, wherein said encapsulation layer dielectric material comprises one or more of: zirconium oxide, titanium oxide, tantalum oxide, yttrium oxide, lanthanum oxide, silicon oxide, aluminum oxide, hafnium oxide, barium zirconate titanate, barium strontium titanate, silicon nitride, silicon oxynitride, UV curable acrylic monomer, acrylic polymer, a UV curable monomer, a thermal curable monomer, silsesquioxane resin, a polymer solution including melted polymer and/or an oligomer solution, a poly methyl methacrylate, a poly vinylphenol, a benzocyclobutene, and/or one or more polyimides.

21. The method of claim 20, wherein said encapsulation layer is formed from substantially the same material as the gate dielectric layer.

22. The method of claim 20, wherein said encapsulation layer comprises zirconium oxide, and is formed to a thickness of approximately 50 nm.

23. The method of claim 14, wherein said gate dielectric layer comprises one or more of: zirconium oxide, titanium oxide, tantalum oxide, yttrium oxide, lanthanum oxide, silicon oxide, aluminum oxide, hafnium oxide, barium zirconate titanate, barium strontium titanate, silicon nitride, silicon oxynitride, UV curable acrylic monomer, acrylic polymer, a UV curable monomer, a thermal curable monomer, silsesquioxane resins, a polymer solution including melted polymer and/or an oligomer solution, a poly methyl methacrylate, a poly vinylphenol, a benzocyclobutene, and/or one or more polyimides.

24. The method of claim 14, wherein said channel layer comprises one or more of: metal oxide including zinc oxide, tin oxide, indium oxide, gallium oxide, and/or combinations thereof; silicon, including amorphous, nanowire, microribbon, and/or polycrystalline silicon, carbon nanotubes, GaAs, Ge, CdS, CdSe, ZnS, ZnSe, SnS2, and/or SnSe2.

25. The method of claim 14, wherein said one or more steps for solution processing comprises one or more of the following: an ejection process, a contact printing process, a screen printing process, and/or a micro dispensing process.

26. The method of claim 25, wherein said ejection process comprises a thermal inkjet process.

* * * * *